United States Patent
Pan et al.

(10) Patent No.: US 9,048,112 B2
(45) Date of Patent: Jun. 2, 2015

(54) INTEGRATED VOLTAGE REGULATOR WITH EMBEDDED PASSIVE DEVICE(S) FOR A STACKED IC

(75) Inventors: Yuancheng Christopher Pan, San Diego, CA (US); Fifin Sweeney, San Diego, CA (US); Lew G. Chua-Eoan, San Diego, CA (US); Zhi Zhu, San Diego, CA (US); Junmou Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 484 days.

(21) Appl. No.: 12/825,937

(22) Filed: Jun. 29, 2010

(65) Prior Publication Data

US 2011/0317387 A1  Dec. 29, 2011

(51) Int. Cl.
*H01R 12/16* (2006.01)
*H01L 25/065* (2006.01)
(Continued)

(52) U.S. Cl.
CPC ...... *H01L 25/0657* (2013.01); *H01L 23/49822* (2013.01); *H01L 23/642* (2013.01); *H01L 23/645* (2013.01); *H01L 24/16* (2013.01); *H01L 24/48* (2013.01); *H01L 25/18* (2013.01); *H01L 2224/13025* (2013.01); *H01L 2224/16227* (2013.01); *H01L 2224/48227* (2013.01); *H01L 2225/06513* (2013.01); *H01L 2225/06517* (2013.01); *H01L 2225/06527* (2013.01); *H01L 2225/06541* (2013.01); *H01L 2924/14* (2013.01); *H01L 2924/15174* (2013.01); *H01L 2924/15192* (2013.01); *H01L 2924/15311* (2013.01); *H01L 2924/19041* (2013.01); *H01L 2924/19042* (2013.01); *H01L 2924/19105* (2013.01);

(Continued)

(58) Field of Classification Search
USPC ................ 361/763–766, 782–784, 790, 803; 257/685–686, 723–730
See application file for complete search history.

(56) References Cited

U.S. PATENT DOCUMENTS

| 6,777,818 B2 | 8/2004 | Baldwin |
| 6,809,421 B1 | 10/2004 | Hayasaka et al. |

(Continued)

FOREIGN PATENT DOCUMENTS

| CN | 101031862 A | 9/2007 |
| EP | 1610599 A1 | 12/2005 |

(Continued)

OTHER PUBLICATIONS

International Search Report and Written Opinion—PCT/US2011/042102, ISA/EPO—Sep. 8, 2011.

*Primary Examiner* — Tuan T Dinh
(74) *Attorney, Agent, or Firm* — Michelle S. Gallardo

(57) ABSTRACT

A stacked integrated circuit includes a first tier IC and a second tier IC. Active faces of the first tier IC and the second tier IC face each other. An interconnect structure, such as microbumps, couples the first tier IC to the second tier IC. An active portion of a voltage regulator is integrated in the first semiconductor IC and coupled to passive components (for example a capacitor or an inductor) embedded in a packaging substrate on which the stacked IC is mounted. The passive components may be multiple through vias in the packaging substrate providing inductance to the active portion of the voltage regulator. The inductance provided to the active portion of the voltage regulator is increased by coupling the through via in the packaging substrate to through vias in a printed circuit board that the packaging substrate is mounted on.

18 Claims, 8 Drawing Sheets

(51) Int. Cl.
 *H01L 23/498* (2006.01)
 *H01L 23/64* (2006.01)
 *H01L 25/18* (2006.01)
 *H01L 23/00* (2006.01)

(52) U.S. Cl.
 CPC ............ *H01L2924/19107* (2013.01); *H01L 2924/30105* (2013.01); *H01L 2924/30107* (2013.01); *H01L 2224/16225* (2013.01)

(56) References Cited

U.S. PATENT DOCUMENTS

| | | | |
|---|---|---|---|
| 6,930,381 | B1 | 8/2005 | Cornelius |
| 7,378,733 | B1 | 5/2008 | Hoang et al. |
| 7,435,619 | B2 | 10/2008 | Shim et al. |
| 7,667,320 | B2 | 2/2010 | Wood et al. |
| 7,872,356 | B2 | 1/2011 | Sanchez et al. |
| 8,812,879 | B2 * | 8/2014 | Wen et al. ............. 713/300 |
| 2006/0063312 | A1 * | 3/2006 | Kurita ................... 438/127 |
| 2006/0071649 | A1 | 4/2006 | Schrom et al. |
| 2006/0071650 | A1 | 4/2006 | Narendra et al. |
| 2006/0180342 | A1 | 8/2006 | Takaya et al. |
| 2007/0010065 | A1 * | 1/2007 | Das et al. ............. 438/393 |
| 2007/0013080 | A1 | 1/2007 | DiBene et al. |
| 2007/0045875 | A1 | 3/2007 | Farnworth et al. |
| 2007/0114651 | A1 | 5/2007 | Marimuthu et al. |
| 2007/0262132 | A1 | 11/2007 | Burton et al. |
| 2008/0001698 | A1 | 1/2008 | Hazucha et al. |
| 2008/0002380 | A1 | 1/2008 | Hazucha et al. |
| 2008/0169896 | A1 | 7/2008 | Edo et al. |
| 2009/0309234 | A1 * | 12/2009 | Knickerbocker et al. ..... 257/774 |
| 2009/0315167 | A1 | 12/2009 | Sasaki et al. |
| 2009/0322414 | A1 * | 12/2009 | Oraw et al. ............. 327/537 |
| 2010/0033236 | A1 | 2/2010 | Triantafillou et al. |
| 2010/0148344 | A1 * | 6/2010 | Chandra et al. ........... 257/690 |
| 2011/0050334 | A1 | 3/2011 | Pan et al. |
| 2011/0215863 | A1 | 9/2011 | Pan et al. |
| 2012/0293972 | A1 | 11/2012 | Pan et al. |

FOREIGN PATENT DOCUMENTS

| | | |
|---|---|---|
| EP | 1761118 A1 | 3/2007 |
| EP | 2018092 A1 | 1/2009 |
| JP | H04211191 A | 8/1992 |
| JP | 2002368428 A | 12/2002 |
| JP | 2003123472 A | 4/2003 |
| JP | 2005183890 A | 7/2005 |
| JP | 2005223226 A | 8/2005 |
| JP | 2008515202 A | 5/2008 |
| JP | 2010507225 A | 3/2010 |
| JP | 2012502476 A | 1/2012 |
| KR | 19970009676 | 6/1997 |
| WO | WO-2006039254 A2 | 4/2006 |
| WO | WO2008003008 A2 | 1/2008 |
| WO | WO-2008144573 A2 | 11/2008 |

\* cited by examiner

INTEGRATED VOLTAGE REGULATOR WITH EMBEDDED PASSIVE DEVICE(S) FOR A STACKED IC

TECHNICAL FIELD

The present disclosure generally relates to integrated circuits (ICs). More specifically, the present disclosure relates to manufacturing integrated circuits.

BACKGROUND

Integrated circuits (ICs) are fabricated on wafers. Commonly, these wafers are semiconductor materials, such as silicon, and singulated to form individual dies. Through efforts of research and development, the size of the transistors making up the ICs has decreased to 45 nm and will soon decrease to 32 nm. As transistor size decreases, the supply voltage to the transistors decreases. The supply voltage is conventionally smaller than wall voltages available in most countries or battery voltages used in portable devices. For example, an IC may operate at 1.25 Volts whereas the wall voltage is 120V or 240V. In a portable device, such as cellular phone, the battery voltage may range from 6V at full charge to 3V at near empty charge.

A semiconductor IC may be coupled to a voltage regulator that converts available voltages at wall outlets or batteries to lower voltages used by the IC. The voltage regulator ensures a constant voltage supply is provided to the IC. This is an important function, because the ability of transistors to tolerate voltages under or over the target voltage is small. Only tenths of a volt lower may create erratic results in the IC; only tenths of a volt higher may damage the IC.

ICs are mounted on a packaging substrate, and the packaging substrate is mounted on a printed circuit board (PCB) approximately 1-2 mm thick during assembly. Conventionally, the voltage regulator is located on the PCB with the IC to which the voltage regulator supplies voltage. Placing the voltage regulator on the PCB separate from the IC results in a voltage drop between the voltage regulator and the IC that the voltage regulator supplies. For example, at a supply voltage of 1.125 Volts, a voltage drop of 0.100V may occur between the voltage regulator and the IC as the voltage passes through the PCB, packaging substrate, and IC. As the supply voltage decreases with shrinking transistor size, the voltage drop becomes a significant fraction of the supply voltage. Additionally, placing the voltage regulator on the PCB uses pins on the IC for the IC to communicate with the voltage regulator. The IC may send commands to the voltage regulator such as sleep or wake-up for scaling up or scaling down the voltage supply. The additional pins consume space on the IC that could otherwise be eliminated.

Reducing the voltage drop from the voltage regulator to the IC improves performance of the IC. Maximum frequency of a IC scales proportionally with supply voltage. For example, eliminating a voltage drop of 0.100V may increase a maximum frequency ($f_{max}$) of the IC by 100 MHz. Alternatively, if the voltage drop is reduced and maximum frequency not increased, power consumption in the IC is reduced. Power consumption is proportional to capacitance multiplied by a square of the supply voltage. Thus, reducing the supply voltage may result in significant power savings.

Further, conventional voltage regulators have slow response times due to the distance between the voltage regulator and the IC. In the event the current transients are too fast for the voltage regulator to respond, decoupling capacitors provide additional power to the IC. Voltage regulators located on the PCB often have response times in the microsecond range. Thus, large decoupling capacitors are placed on the packaging substrate to compensate for slow response times. The large decoupling capacitors occupy a large area. One conventional arrangement includes a bulk capacitor of microFarads and a multi-layer chip capacitor (MLCC) having hundreds of nanoFarads along with the voltage regulator on the PCB. The combination of the bulk capacitor and the MLCC supplies voltage to the IC while the voltage regulator responds to the current transient.

Attempts have been made to place voltage regulators on the ICs. However, voltage regulators include passive components such as inductors and capacitors that are also embedded in the ICs. Passive devices consume a large amount of IC area, which increases manufacturing cost. For example, a IC manufactured using 45 nm technology has a capacitance density of 10 femtoFarads/$\mu m^2$. At this density a suitable amount of capacitance may consume over 2.5 $mm^2$. Providing inductance to the voltage regulator conventionally uses an on-IC inductor or a discrete inductor mounted on the packaging substrate. In addition to consuming large areas on a IC, conventional on-IC inductors have a low quality factor.

The quality factor, defined by the energy stored in a passive component versus energy dissipated in the passive component, for a passive component embedded in a IC is low. Conventionally, the passive components are manufactured thin to fit in the IC and suffer conductive or magnetic losses that degrade the quality factor.

Additional problems arise when supplying voltage to the ICs of a stacked IC using conventional solutions. Specifically, supplying voltage to the second tier of a stacked IC is conventionally accomplished with wire-bonding. Wire-bonding is completed after assembly of the stacked IC and has a limited connection density based on size of the wire bond. Another conventional solution includes providing the supply voltage to the second tier IC with through silicon vias in the first tier IC. Through silicon vias have a high resistance resulting in voltage drop that further decreases performance and occupy space on the ICs that could otherwise be used active circuitry.

Thus, there is a need for a supplying voltage to a stacked IC that is in close proximity to circuitry of the stacked IC.

BRIEF SUMMARY

According to one aspect of the disclosure, a stacked integrated circuit includes a first semiconductor IC having a first active face, and a first interconnect structure. The stacked integrated circuit also includes a second semiconductor IC stacked on the first semiconductor IC having a second active face appearing opposite the first active face and a second interconnect structure coupled to the first interconnect structure. The second active face receives regulated voltage from a voltage regulator. The stacked integrated circuit further includes an active portion of the voltage regulator in the first semiconductor IC coupled to the first interconnect structure supplying regulated voltage to the first IC.

According to another aspect of the disclosure, a method of manufacturing a voltage regulator of a stacked IC having a first tier IC and a second tier IC mounted on a packaging substrate includes integrating an active portion of a voltage regulator in the first tier IC. The method also includes coupling the active portion of the voltage regulator to at least one passive component at least partially embedded in the packaging substrate. The method further includes coupling active circuitry of the first tier IC to the voltage regulator. The method also includes coupling the second tier IC to the voltage regulator.

According to a further aspect of the disclosure, a method of supplying voltage to a stacked IC mounted on a packaging substrate having a first tier IC and a second tier IC, the method includes providing a supply voltage to an active portion of a voltage regulator integrated in the first tier IC of the stacked. The method also includes passing the supply voltage from the active portion of the voltage regulator to at least one inductor at least partially embedded in the packaging substrate. The method further includes passing the supply voltage from the at least one inductor to at least one capacitor. The method also includes passing the supply voltage from the at least one capacitor to the first tier IC. The method yet also includes passing the supply voltage from the first tier IC to the second tier IC.

According to yet another aspect of the disclosure, a stacked integrated circuit includes a packaging substrate. The stacked integrated circuit also includes a first tier IC having a first interconnect structure coupled to the packaging substrate. The stacked integrated circuit further includes a second tier IC having a second interconnect structure coupled to the first tier IC. The stacked integrated circuit yet also includes a means for regulating voltage integrated in the first tier IC.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
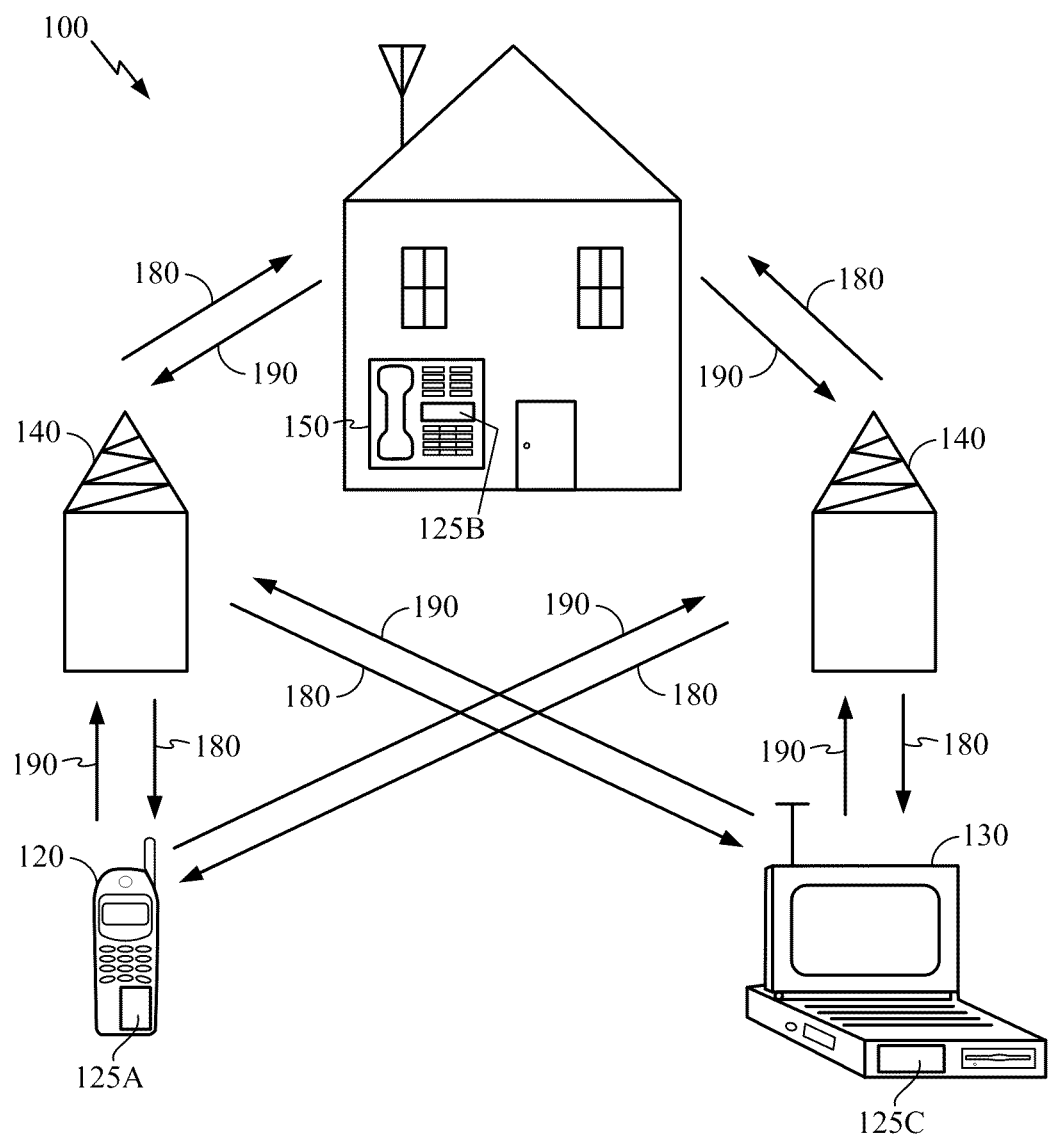
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, as disclosed below. It will be recognized that any device containing an IC may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 1 illustrates remote units according to the teachings of the disclosure, the disclosure is not limited to these exemplary illustrated units. The disclosure may be suitably employed in any device which includes semiconductor components, as described below.

Figure 2:
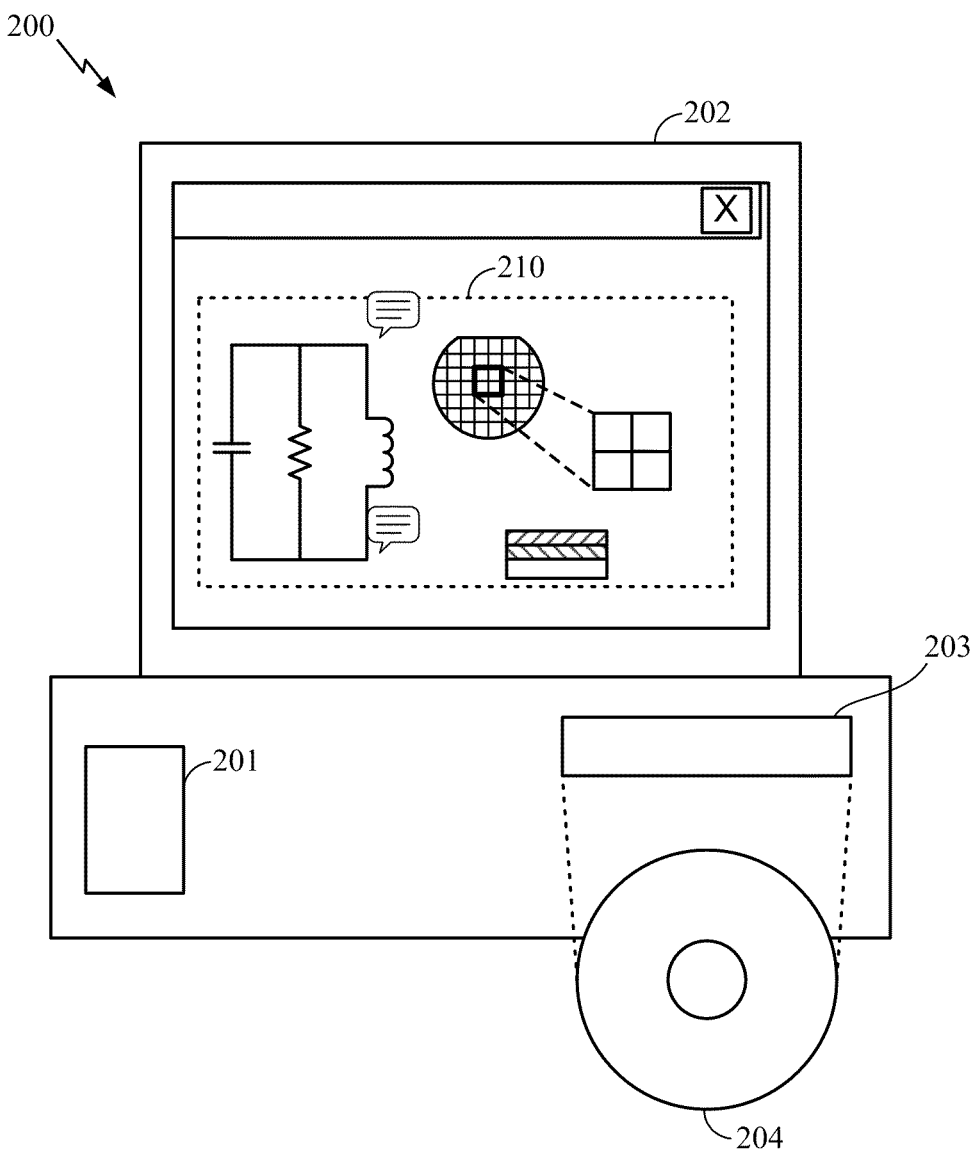
FIG. 2 is a block diagram illustrating a design workstation used for circuit, layout, and logic design of the disclosed semiconductor IC package.

FIG. 2 is a block diagram illustrating a design workstation for circuit, layout and design of a semiconductor part as disclosed below. A design workstation 200 includes a hard disk 201 containing operating system software, support files, and design software such as Cadence or OrCAD. The design workstation 200 also includes a display to facilitate design of a semiconductor part 210 that may include a circuit and semiconductor ICs. A storage medium 204 is provided for tangibly storing the semiconductor part 210. The semiconductor part 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify circuit configurations, pattern data for photolithography masks, or mask pattern data for serial write tools such as electron beam lithography. Providing data on the storage medium 204 facilitates the design of the semiconductor part 210 by decreasing the number of processes for designing circuits and semiconductor ICs.

Figure 3A:
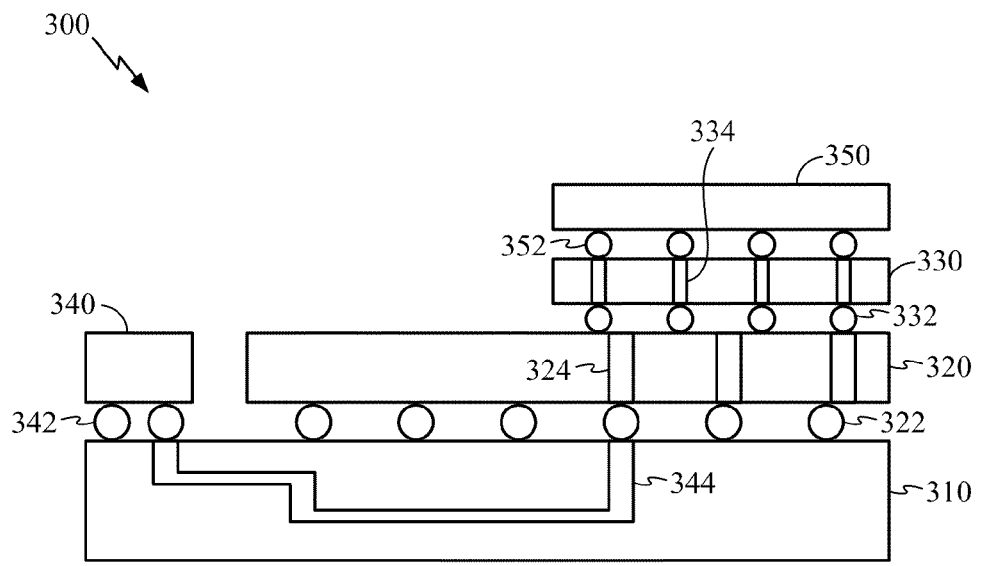
FIG. 3A is a block diagram illustrating a conventional voltage regulator on a printed circuit board.

FIG. 3 is a block diagram illustrating a conventional voltage regulator on a printed circuit board. An IC product 300 includes a printed circuit board (PCB) 310 that supports packaging substrates and provides communication between packaging substrates on the PCB 310. A packaging substrate 320 is coupled to the PCB 310 through a packaging connection 322 such as bumps or pillars and includes through vias 324 to enable communications between the PCB 310 and a IC 330. The IC 330 is coupled to the packaging substrate 320 through an interconnect structure 332 such as bumps or pillars. Stacked above the IC 330 is a second tier IC 350. An interconnect structure 352 couples the second tier IC 350 to the packaging substrate 320 with through silicon vias 334 in the IC 330.

A voltage regulator 340 is coupled to the PCB 310 through a packaging connection 342. The voltage regulator 340 conventionally couples to discrete passive components such as inductors and capacitors mounted on the PCB 310. Low inductance passes such as traces 344 provide voltage from the voltage regulator 340 to the IC 350 with through silicon vias 324 and through silicon vias 334. The traces 344 are restricted in location on the PCB 310, which also restricts location of the voltage regulator 340. Thus, the distance between the voltage regulator 340 and the IC 350 has a fixed minimum based on the PCB 310.

For the reasons discussed above including: large voltage drop between the voltage regulator and the IC, slow response times due to distance from the IC to the voltage regulator, increased PCB size, the use of large decoupling capacitors, and the use of additional pins on the IC to communicate with the voltage regulator, locating a voltage regulator on the PCB separate from the packaging substrate may not provide sufficient voltages to the IC for proper operation. If the supply voltage drops below an acceptable level, the IC may output incorrect results or stop working completely.

Figure 3B:
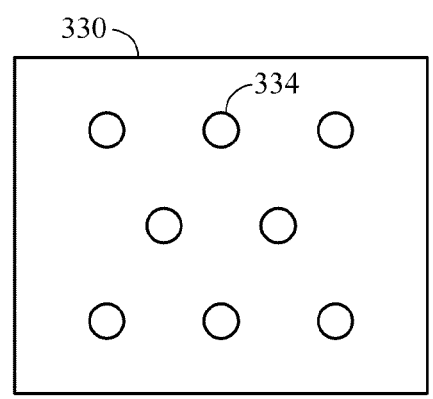
FIG. 3B is a top-down view of a semiconductor IC illustrating conventional placement of through silicon vias.

FIG. 3B is a top-down view of a semiconductor IC illustrating conventional placement of through silicon vias. The through silicon vias 334 enable communication between both sides of the IC 330. In one embodiment, the through silicon vias 334 provide voltage to a second IC 350 stacked on the IC 330. In this embodiment, the through silicon vias 334 are spaced apart because of the large size of the through silicon vias 334 to supply voltage and large currents to the second IC 350. Organizing digital circuitry on the IC 330 around the through silicon vias 334 is difficult because of the size and position of the through silicon vias 334.

Providing voltage to a second tier IC of a stacked IC from a voltage regulator mounted on a PCB is difficult due to the distance between the voltage regulator and the second tier IC. Through silicon vias located in a first tier conventionally used to couple the second tier IC to the PCB have a high resistance. Thus, the supply voltage is of a lower quality after passing through the high resistance through silicon vias of the first tier IC. Additionally, the number of vias supplying voltage to the second tier IC through the first tier IC creates problems with mounting the first tier IC on the packaging substrate. For example, during assembly when the first tier IC is welded to the packaging substrate, the large number of vias for supplying voltage to the second tier IC decreases assembly throughput and decreases yield.

Further, passing the supply voltage from a voltage regulator on the PCB to ICs of the stacked IC results in a degraded supply voltage because of a large voltage drop between the voltage regulator and ICs of the stacked IC, slow response times due to distance from ICs of the stacked IC to the voltage regulator, increased PCB size, the use of large decoupling capacitors, and the use of additional pins on ICs of the stacked IC to communicate with the voltage regulator. As a result, locating a voltage regulator on the PCB separate from the packaging substrate may not provide sufficient voltages to ICs of the stacked IC for proper operation.

According to one embodiment, an active portion of a voltage regulator is integrated into the IC. The active portion of the voltage regulator includes, for example, transistors and drivers. Locating an active portion of an integrated voltage regulator in the first tier IC reduces the number of packaging connections between the first tier IC and the packaging substrate. The integrated voltage regulator is also closer to the first tier IC and the second tier IC resulting in quicker response times to current transients and smaller decoupling capacitors to filter the output of the voltage regulator. In a stacked IC configuration having the active side of the first tier IC facing the active side of the second tier IC, the active portion of the voltage regulator is in close proximity to circuitry on both the first tier IC and the second tier IC. Furthermore, passive components may be embedded in the packaging substrate to reduce area on the first tier IC occupied by the voltage regulator.

In another embodiment, passive components are embedded in a PCB. Embedding the passive components maintains a short and low inductance path from the voltage regulator to the IC. Further, the voltage regulator control loop bandwidth is increased by higher switching frequency and shortened feedback path between the voltage regulator and the IC. Embedding passive components also reduces IC size by reducing or eliminating discrete passive components of the voltage regulator from the IC itself.

Figure 4:
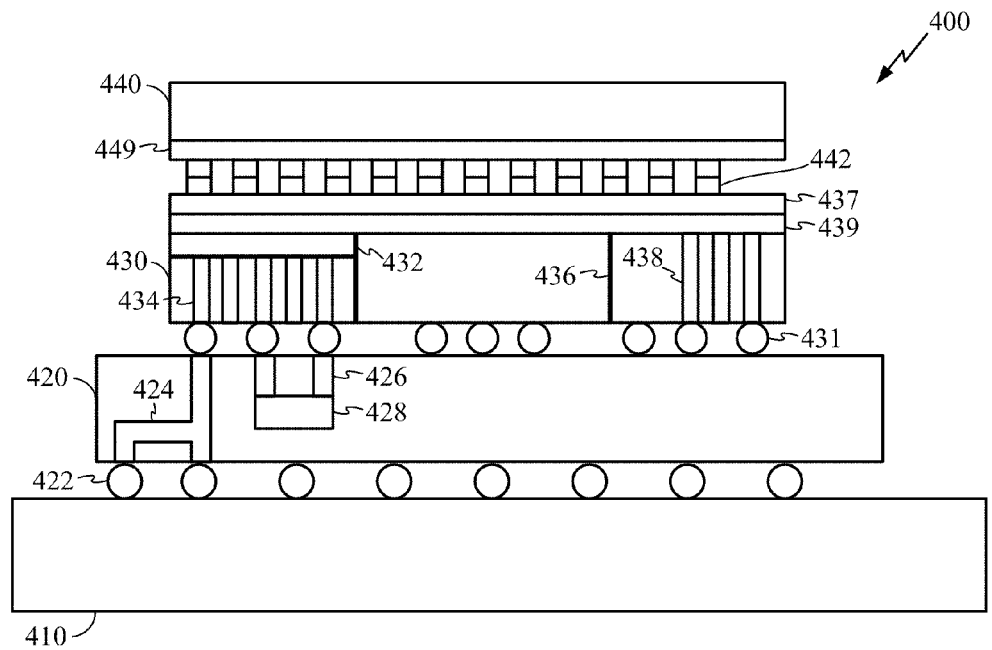
FIG. 4 is a block diagram illustrating an exemplary integrated voltage regulator in a stacked IC according to one embodiment.

FIG. 4 is a block diagram illustrating an exemplary integrated voltage regulator in a stacked IC according to one embodiment. A packaged IC 400 includes a stacked IC having a first tier IC 430 and a second tier IC 440. An active face 439 of the first tier IC 430 faces an active face 449 of the second tier IC 440. The first tier IC 430 is coupled to the second tier IC 440 through an interconnect structure 442, such as microbumps. The first tier IC 430 includes an active portion of a voltage regulator 432 and an input/output area 436. The active portion of the voltage regulator 432 and the input/output area 436 include through silicon vias 434, 438. The through silicon vias 438 enable communication between the second tier IC 440 and a packaging substrate 420. In one case the second tier IC 440 is a memory device cooperating with the first tier IC 430. In this case a reduced number of through silicon vias 438 exist. According to one embodiment, through silicon vias in the first tier IC outside of the active portion of the voltage regulator 432 and the input/output area 436 are reduced or eliminated.

The first tier IC 430 is coupled to the packaging substrate 420. Passive components for the active portion of the voltage regulator 432, such as inductors, are embedded in the packaging substrate 420. An embedded inductance 428 in the packaging substrate 420 is coupled to packaging connections 431 by an electrical path 426. Thus, the embedded inductance 428 is coupled to the active portion of the voltage regulator 432 through the electrical path 426, packaging connections 431, and through silicon vias 434. A decoupling capacitor (not shown) may be similarly embedded in the packaging substrate 420 to provide instantaneous voltage in the case where a current transient exceeds the capability of the active portion of the voltage regulator 432 to provide voltage.

A supply voltage is provided to the active portion of the voltage regulator 432 through interconnects (not shown) in a printed circuit board (PCB) 410. The PCB 410 is coupled to the packaging substrate 420 through a packaging connection 422. An electrical path 424 in the packaging substrate 420 couples the packaging connection 422 to the packaging connection 431. Thus, the supply voltage is passed through the PCB 410, the packaging connection 422, the electrical path 424, the packaging connection 431, and the through silicon vias 434. The electrical path 424, 426 may include vias, through vias, and/or interconnects that form a conductive path in the packaging substrate 420.

The voltage regulator (including the passives) is in close proximity to circuitry (not shown) on the first tier IC 430 and circuitry (not shown) on the second tier IC 440. As a result, voltage drop between the circuitry and the voltage regulator is reduced. For example, the voltage drop may be as small as tens of millivolts. According to one embodiment, the second tier IC 440 is coupled to the active portion of the voltage regulator 432 by the interconnect structure 442. Additionally, a redistribution layer 437 may be deposited on the first tier IC 430 for coupling the second tier IC 440 to the voltage regulator. Alternatively, the redistribution layer 437 may be on the second tier IC 440 for coupling the voltage regulator to the first tier IC 430. The redistribution layer 437 may also distribute the supply voltage to circuitry on the first tier IC 430. According to one embodiment, the redistribution layer 437 is a thick conducting layer, such as aluminum.

Supplying voltage to the second tier IC of a stacked IC from a voltage regulator integrated into the first tier IC using microbumps provides a high density and low resistance path improving quality and stability of the supply voltage for the second tier IC.

Figure 5:
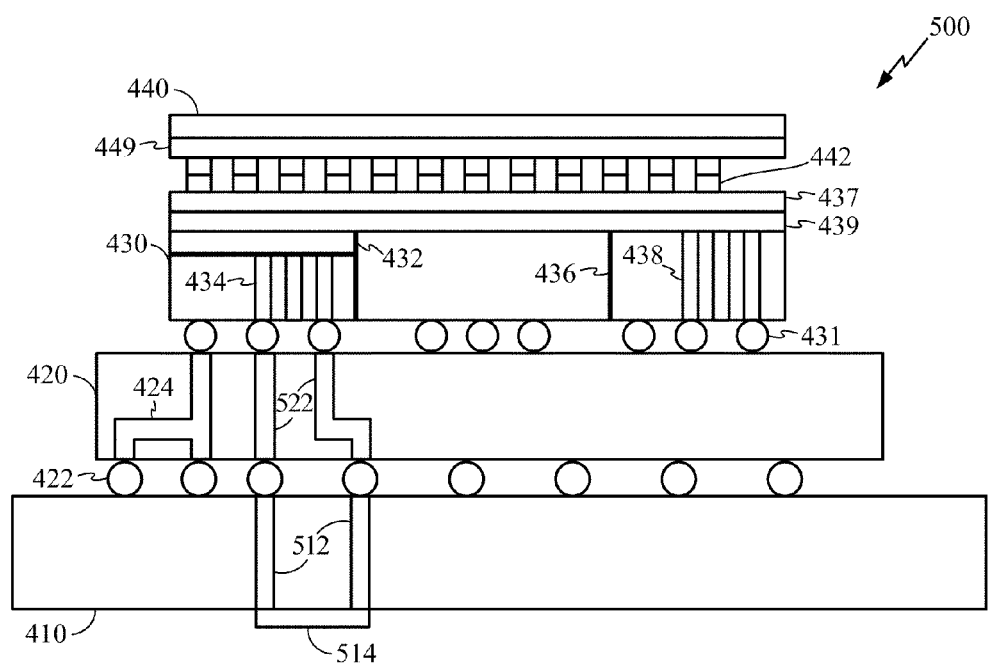
FIG. 5 is a block diagram illustrating an exemplary integrated voltage regulator in a stacked IC having through vias as inductors according to one embodiment.

In another embodiment, inductance to the active portion of the voltage regulator is provided with through vias in the packaging substrate and optionally in the PCB. FIG. 5 is a block diagram illustrating an exemplary integrated voltage regulator in a stacked IC having through vias as inductors according to one embodiment. An electrical path 522 in the packaging substrate 420 provides inductance to the active portion of the voltage regulator 432. The electrical path 522 may include, for example, a pair of through vias. Inductance is proportional to the length of the electrical path 522. The electrical path 522 may couple through interconnects in the packaging substrate 420 or through a conductive layer on a side of the packaging substrate 420 facing the PCB 410. If additional inductance is desired, additional length may be provided by an electrical path 512 in the PCB 410. The electrical path 512 is completed through a bottom conductive layer 514 of the PCB 410. The packaging connection 422 couples the electrical path 522 to the electrical path 512. The inductance provided to the active portion of the voltage regulator 432 is proportional to the cumulative length of the electrical path 522 and the electrical path 512.

According to one embodiment, the inductance may be outside of the packaging substrate 420. For example, wirebonds (not shown) may couple from the first tier IC 430 to the packaging substrate 420 to provide the inductance. In yet another embodiment (not shown) the inductance results from the wire bonds in addition to the electrical paths 522 and 512/514.

Figure 6:
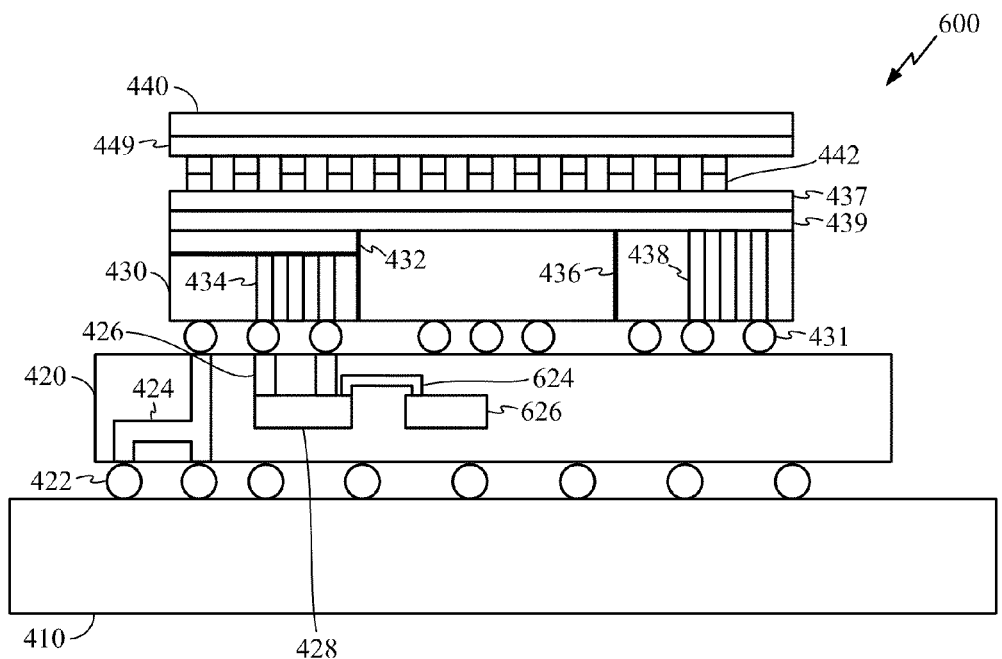
FIG. 6 is a block diagram illustrating an exemplary integrated voltage regulator in a stacked IC having an embedded capacitance according to one embodiment.

In addition to providing inductance to the active portion of the voltage regulator, an embedded capacitance may be provided to the active portion of the voltage regulator. FIG. 6 is a block diagram illustrating an exemplary integrated voltage regulator in a stacked IC having an embedded capacitance according to one embodiment. Passive components coupled to the active portion of the voltage regulator 432 may be embedded in the packaging substrate 420 such as the embedded inductance 428 and an embedded capacitance 626 using, for example, embedded IC substrate (EDS) technology.

The electrical path 426 couples the embedded inductance 428 to the packaging connection 431. Additionally, an electrical path 624 couples the embedded capacitance 626 to the embedded inductance 428. That is, the embedded capacitance 626 is coupled to the active portion of the voltage regulator 432 through the electrical path 624, the electrical path 426, the packaging connection 431, and the through silicon vias 434.

Figure 7:
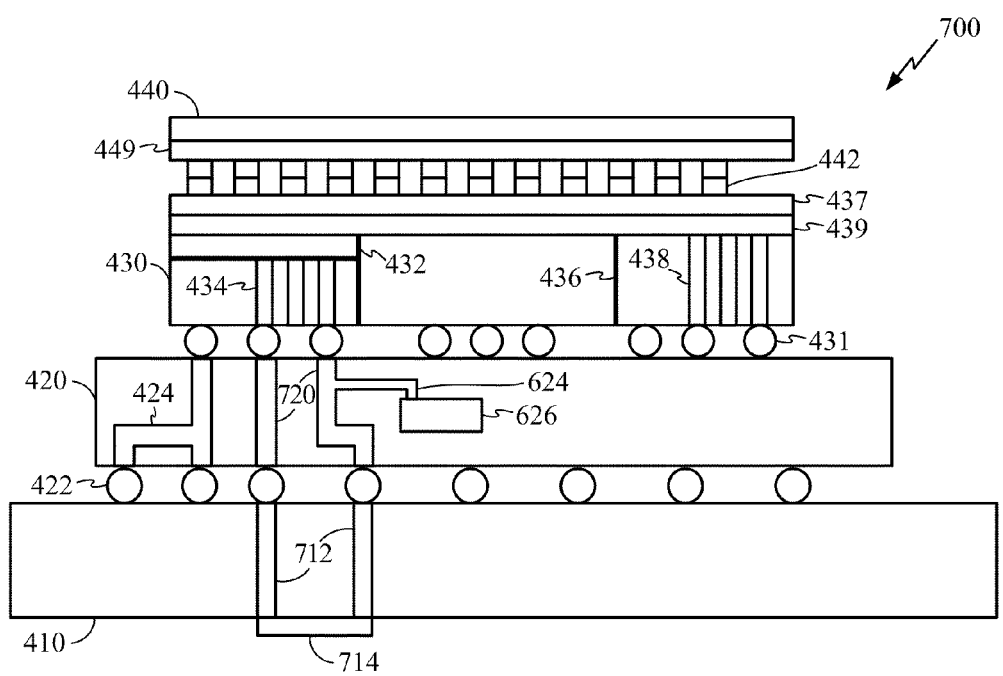
FIG. 7 is a block diagram illustrating an exemplary integrated voltage regulator in a stacked IC having an embedded capacitance and through vias as inductors according to one embodiment.

Alternatively, inductance to the active portion of the voltage regulator may be provided with through vias in the packaging substrate. FIG. 7 is a block diagram illustrating an exemplary integrated voltage regulator in a stacked IC having an embedded capacitance and through vias as inductors according to one embodiment. The electrical path 720 in the packaging substrate 420 provides inductance to the active portion of the voltage regulator 432. The electrical path 720 may include, for example, a through via. Inductance is proportional to the length of the electrical path 720. The electrical path 720 may couple through interconnects in the packaging substrate 420 or through a conductive layer on a side of the packaging substrate 420 facing the PCB 410. If additional inductance is desired, additional length may be provided by the electrical path 712 in the PCB 410. The electrical path 712 is completed through a bottom conductive layer 714 of the PCB 410. The packaging connection 422 couples the electrical path 720 to the electrical path 712. That is, the inductance provided to the active portion of the voltage regulator 432 is proportional to the cumulative length of the electrical path 720 and the electrical path 712.

The embedded capacitance 626 is embedded in the packaging substrate 420 using, for example, embedded die substrate (EDS) technology. The electrical path 624 couples the embedded capacitance 626 to the embedded inductance 720. That is, the embedded capacitance 626 is coupled to the active portion of the voltage regulator 432 through the electrical path 624, the embedded inductance 720, the packaging connection 431, and the through silicon vias 434.

Figure 8A:
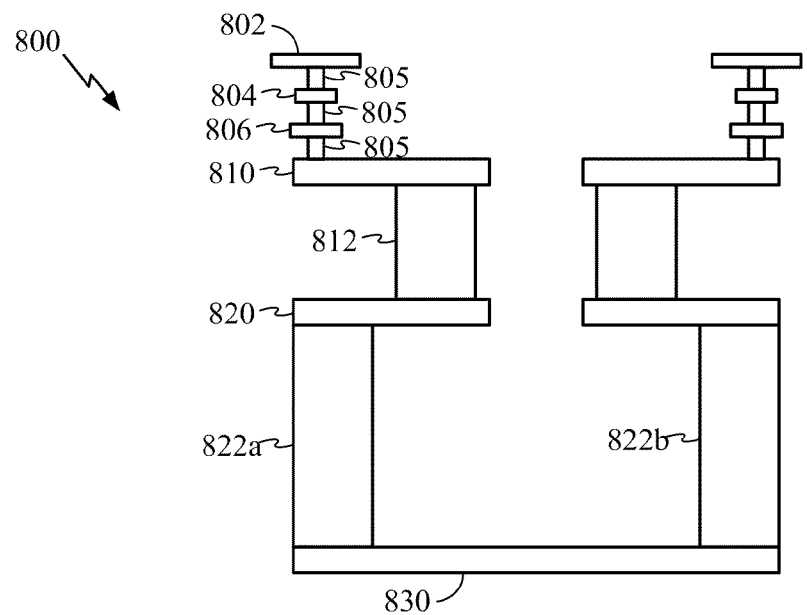
FIGS. 8A-C are block diagram illustrating paths through a packaging substrate and printed circuit board that may provide inductance.
Figure 8B:
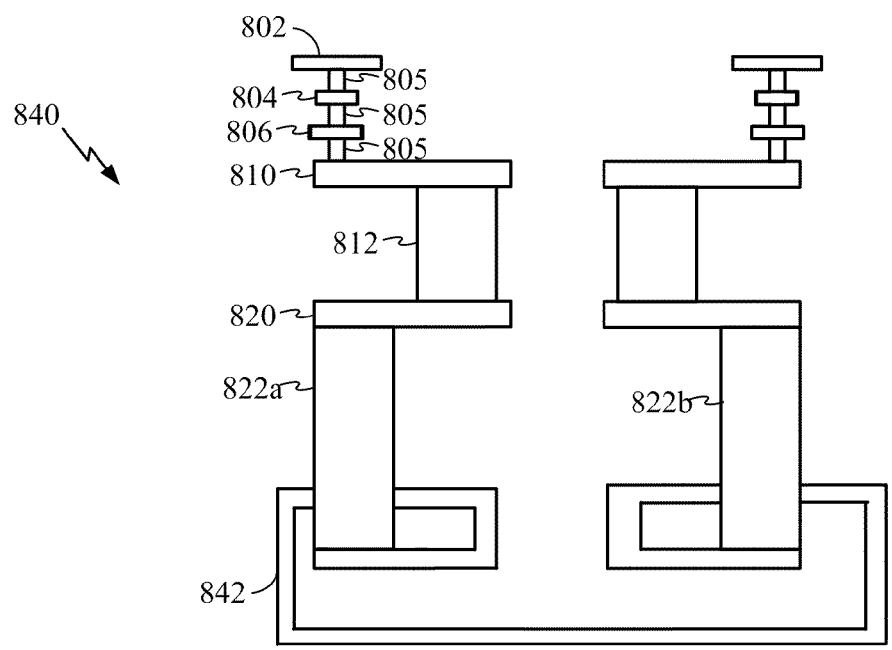
Figure 8C:
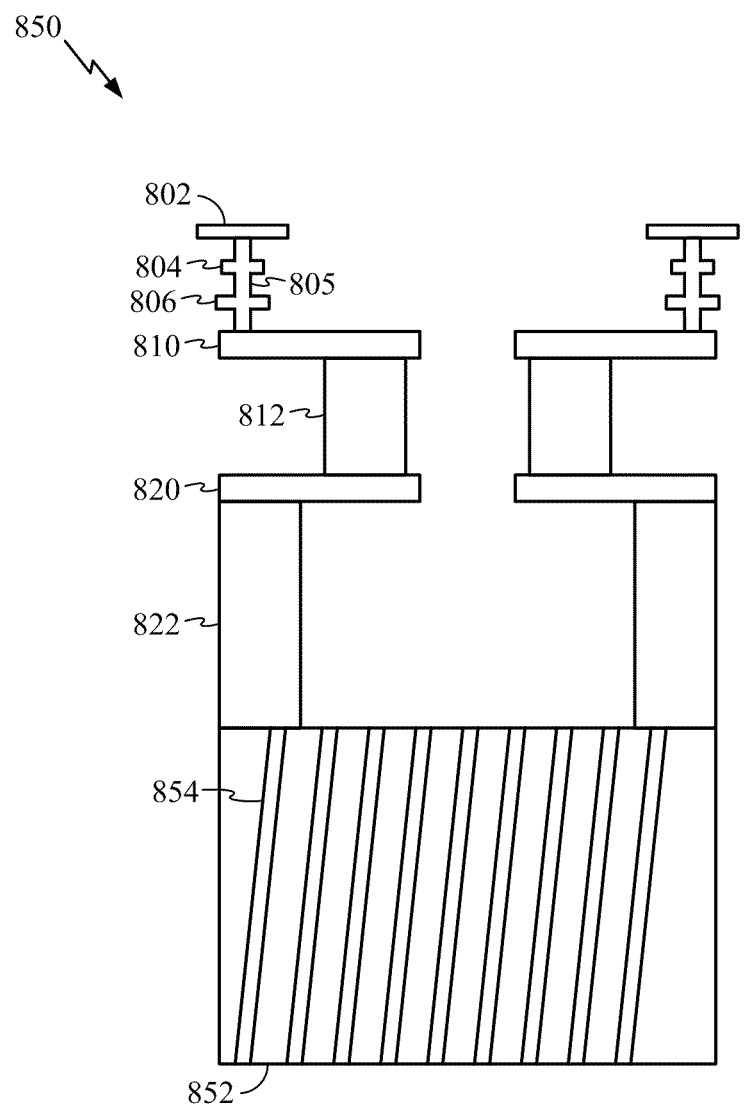

Embedded passives in which through vias provide inductance for a voltage regulator will now be described in further detail. FIGS. 8A-C are block diagrams illustrating paths through a packaging substrate and PCB that may provide inductance.

FIG. 8A is a block diagram illustrating a path 800 through a packaging substrate and PCB according to one embodiment. A top conductive layer 802 and a bottom conductive layer 810 of a packaging substrate are shown. Inner layers 804, 806 of the packaging substrate are also shown. A series of vias 805, couples the top conductive layer 802 and the bottom conductive layer 810. A packaging connection 812 may be a bump of a ball grid array or a pillar and couples the bottom conductive layer 810 to a top conductive layer 820 of a PCB. A through via 822a couples the top conductive layer 820 to a bottom conductive layer 830. The bottom conductive layer 830 may be an interconnect that couples to another through via 822b in the PCB. The amount of inductance in the path 800 is proportional to a length of the path 800.

FIG. 8B is a block diagram illustrating a path 840 having a longer length than the path 800. A bottom conductive layer 842 couples the through via 822a to another through via 822b in the PCB. The bottom conductive layer 842 includes extra length, for example in a coil, which increases the inductance of the path 840.

FIG. 8C is a block diagram illustrating a path 850 having a longer length than the path 840. An inductor coil 852 mounted on a back side of the PCB couples the through via 822a to another through via 822b in the PCB. In this case, a coiled wire 854 wraps around another inductor coil 852 to extend the length of the path 850.

A voltage regulator with passives embedded in packaging maintains a short and low inductive path from the voltage regulator to the IC. Further, the embedded passive components reduce packaging substrate top side area consumed by passive components.

One advantage to locating the active portion of the voltage regulator in a first tier IC of a stacked IC is reducing a number of through silicon vias manufactured in the first tier IC. The active portion of the voltage regulator when integrated into the first tier IC supplies voltage to the second tier IC through the interconnect structure between the first tier IC and the second tier IC. Thus, a reduced number of through silicon vias in the first tier IC are used for supplying voltage to the second tier IC. That is, few or no through silicon vias in the first tier IC couple the second tier IC to a power supply on the PCB because power is provided by the voltage regulator on the first tier IC. One exemplary arrangement of through silicon vias in a first tier IC of a stacked IC is described with reference to FIG. 9.

Figure 9:
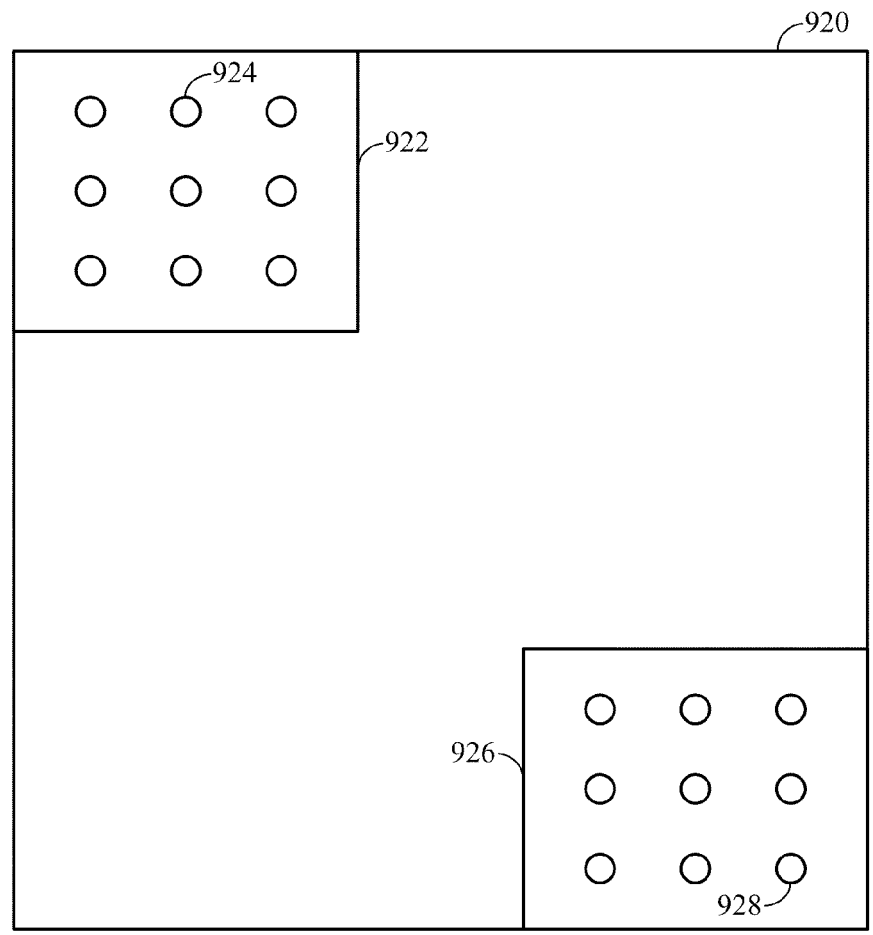
FIG. 9 is a top-down view of a semiconductor IC having an exemplary arrangement of through silicon vias according to one embodiment.

FIG. 9 is a top-down view of a semiconductor IC having an exemplary arrangement of through silicon vias according to one embodiment. A semiconductor IC 920 includes an active portion of a voltage regulator 922 and an input/output area 926. The semiconductor IC 920 may be, for example, a first tier IC of a stacked IC. The input/output area 926 may include through silicon vias 928. The through silicon vias 928 enable communications for input/output with circuitry on a IC (not shown) stacked above the semiconductor IC 920 from a packaging substrate (not shown) below the semiconductor IC 920. Through silicon vias 924 in the active portion of the voltage regulator 922 couple the active portion of the voltage regulator 922 to passive components embedded in the packaging substrate (not shown) below the semiconductor IC 920.

The through silicon vias 924, 928 may be isolated in portions of the semiconductor IC 920. This may result in a smaller size of the semiconductor IC 920. For example, circuitry on the semiconductor IC 920 is organized to avoid interference from the through silicon vias 924, 928. That is, where there are through silicon vias 924, 928 in the semiconductor IC 920, circuitry is not built. Isolating the through silicon vias 924, 928 to regions of the semiconductor IC 920 reduces design complexity of circuitry on the semiconductor IC 920 allowing higher densities of circuitry. In one embodiment (not shown), the input/output vias 928 are provided around the periphery of the IC 920, instead of in the area 926 shown in FIG. 9.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A stacked semiconductor integrated circuit (IC) package, comprising:
   a first active circuitry of a semiconductor IC configured to receive a regulated voltage from a voltage regulator;
   an input/output area including a first set of through substrate vias, wherein the first set of through substrate vias are configured to enable-communication between circuitry on a different semiconductor IC and a packaging substrate coupled to the semiconductor IC;
   wherein the first active circuitry of the semiconductor IC faces a second active circuitry of the different semiconductor IC;
   an active portion of the voltage regulator coupled to a second set of through substrate vias, wherein the second set of through substrate vias are configured to couple the active portion of the voltage regulator to passive components of the voltage regulator, wherein the passive components are embedded in the packaging substrate; and
   a redistribution layer on at least one of the semiconductor IC or the different semiconductor IC, the redistribution layer configured to distribute the regulated voltage from the active portion of the voltage regulator to at least one of the semiconductor IC or the different semiconductor IC.

2. The stacked semiconductor integrated circuit (IC) package of claim 1, integrated into a device selected from a group consisting fo a set top box, a music player, a video player, an entertainment unit, a navigation device, a communications device, a personal digital assistant (PDA), a fixed location data unit, and a computer.

3. A stacked semiconductor integrated circuit (IC) package, comprising:
   a first active circuitry of a semiconductor IC configured to receive a regulated voltage from a voltage regulating means;
   an input/output area including a first set of interconnect means, wherein the first set of interconnect means are configured to enable communication between circuitry on a different semiconductor IC and a packaging substrate coupled to the semiconductor IC;
   wherein the first active circuitry of the semiconductor IC faces a second active circuitry of the different semiconductor IC;
   an active portion of the voltage regulating means coupled to a second set of interconnect means, wherein the second set of interconnect means are configured to couple the active portion of the voltage regulating means to passive components of the voltage regulating means, wherein the passive components are embedded in the packaging substrate; and
   a redistribution layer in at least one of the semiconductor IC or the different semiconductor IC, the redistribution layer configured to distribute the regulated voltage from the active portion of the voltage regulator to at least one of the semiconductor IC or the different semiconductor IC.

4. The stacked semiconductor integrated circuit (IC) package of claim 3, integrated into a device selected from a group consisting of a set top box, a music player, a video player, an entertainment unit, a navigation device, a communications device, a personal digital assistant (PDA), a fixed location data unit, and a computer.

5. A stacked integrated circuit (IC), comprising:
a first semiconductor IC having a first active circuitry configured to receive a regulated voltage from a voltage regulator;
a second semiconductor IC coupled to the first semiconductor IC, an active portion of the voltage regulator integrated in the second semiconductor IC and coupled to a first set of through substrate vias in the second semiconductor IC, the first set of through substrate vias configured to couple the active portion of the voltage regulator to passive components of the voltage regulator, the passive components embedded in a packaging substrate coupled to the second semiconductor IC, the second semiconductor IC having an input/output area including a second set of through substrate vias, the second set of through substrate vias configured to enable communication between the first active circuitry on the first semiconductor IC and the packaging substrate, the first active circuitry of the first semiconductor IC facing a second active circuitry of the second semiconductor IC; and
a redistribution layer on at least one of the first semiconductor IC or the second semiconductor IC, the redistribution layer configured to distribute the regulated voltage from the active portion of the voltage regulator to at least one of the first semiconductor IC or the second semiconductor IC.

6. The stacked integrated circuit of claim 5, further comprising:
a packaging connection on the second semiconductor IC coupled to the first set of through substrate vias, at least one of the passive components is at least partially embedded in the packaging substrate, the at least one of the passive components coupled to the packaging connection and cooperating with the active portion of the voltage regulator to provide the regulated voltage for at least one of the first semiconductor IC or the second semiconductor IC.

7. The stacked integrated circuit of claim 5, wherein the stacked integrated circuit is integrated into a device selected from a group consisting of a set top box, a music player, a video player, an entertainment unit, a navigation device, a communications device, a personal digital assistant (PDA), a fixed location data unit, and a computer.

8. The stacked integrated circuit of claim 5, wherein the voltage regulator is further configured to supply regulated voltage to the second active circuitry of the second semiconductor IC.

9. The stacked integrated circuit of claim 6, wherein the at least one of the passive components comprises at least one inductor.

10. The stacked integrated circuit of claim 6, wherein the at least one of the passive component comprises at least one capacitor.

11. The stacked integrated circuit of claim 9, further comprising a decoupling capacitor at least partially embedded in the packaging substrate and coupled to the active portion of the voltage regulator.

12. The stacked integrated circuit of claim 9, wherein the at least one inductor comprises a plurality of electrical paths in the packaging substrate coupled to the first set of through substrate vias.

13. The stacked integrated circuit of claim 10, wherein the at least one capacitor comprises an embedded die.

14. The stacked integrated circuit of claim 12, further comprising:
a second packaging connection on the packaging substrate coupled to a plurality of through substrate vias in the packaging substrate;
a printed circuit board coupled to the packaging substrate, the printed circuit board having a plurality of through substrate vias coupled to the plurality of through substrate vias in the packaging substrate to provide additional inductance to the active portion of the voltage regulator; and
at least one conducting path on the printed circuit board, the at least one conducting path coupling at least two through substrate vias of the plurality of through substrate vias in the printed circuit board.

15. The stacked integrated circuit of claim 14, wherein the at least one conducting path comprises a non-linear segment of wire.

16. The stacked integrated circuit of claim 14, wherein the at least one conducting path comprises an inductor coil mounted on a back side of the printed circuit board.

17. A stacked integrated circuit (IC), comprising:
a first semiconductor IC having a first active circuitry configured to receive a regulated voltage from a means for regulating a voltage;
a second semiconductor IC coupled to the first semiconductor IC, an active portion of the voltage regulating means integrated in the second semiconductor IC and coupled to means for coupling the active portion of the voltage regulating means to passive components of the voltage regulating means, the passive components embedded in a packaging substrate coupled to the second semiconductor IC, the second semiconductor IC having an input/output area including a means for communicating between the first active circuitry on the first semiconductor IC and the packaging substrate; and
a redistribution layer on at least one of the first semiconductor IC or the second semiconductor IC, the redistribution layer configured to distribute the regulated voltage from the active portion of the voltage regulating means to at least one of the first semiconductor IC or the second semiconductor IC.

18. The stacked integrated circuit (IC) of claim 17, integrated into a device selected from a group consisting of a set top box, a music player, a video player, an entertainment unit, a navigation device, a communications device, a personal digital assistant (PDA), a fixed location data unit, and a computer.

* * * * *

UNITED STATES PATENT AND TRADEMARK OFFICE
CERTIFICATE OF CORRECTION

| | | |
|---|---|---|
| PATENT NO. | : 9,048,112 B2 | Page 1 of 1 |
| APPLICATION NO. | : 12/825937 | |
| DATED | : June 2, 2015 | |
| INVENTOR(S) | : Pan et al. | |

It is certified that error appears in the above-identified patent and that said Letters Patent is hereby corrected as shown below:

On the Title Page:

(75) Inventors, insert -- Jason Gonzalez -- as the sixth inventor.

Signed and Sealed this
Ninth Day of February, 2016

Michelle K. Lee
*Director of the United States Patent and Trademark Office*